(12) United States Patent
Urquhart et al.

(10) Patent No.: US 6,799,883 B1
(45) Date of Patent: Oct. 5, 2004

(54) METHOD FOR CONTINUOUSLY BLENDING CHEMICAL SOLUTIONS

(75) Inventors: Karl J. Urquhart, McKinney, TX (US); John B. Thompson, Sherman, TX (US); Joe G. Hoffman, Dallas, TX (US)

(73) Assignee: Air Liquide America L.P., Houston, TX (US)

( * ) Notice: Subject to any disclaimer, the term of this patent is extended or adjusted under 35 U.S.C. 154(b) by 0 days.

(21) Appl. No.: 09/468,411

(22) Filed: Dec. 20, 1999

Related U.S. Application Data (63) Continuation-in-part of application No. 09/051,304, filed as application No. PCT/US96/10389 on Jun. 5, 1996, now Pat. No. 6,050,283.

(51) Int. Cl.[7] .............................................. B01F 15/04
(52) U.S. Cl. ............................. 366/152.4; 366/152.1; 137/3; 137/5
(58) Field of Search ....................... 366/151.1, 152.1, 366/152.4, 162.1; 137/3, 5

(56) References Cited

U.S. PATENT DOCUMENTS

| | | | | |
|---|---|---|---|---|
| 2,152,956 | A | * | 4/1939 | Etzkorn |
| 4,405,656 | A | * | 9/1983 | Shimizu et al. |
| 5,157,332 | A | * | 10/1992 | Reese |
| 5,407,526 | A | * | 4/1995 | Danielson et al. |
| 5,722,442 | A | | 3/1998 | Hoffman et al. ......... 134/102.1 |
| 5,755,934 | A | | 5/1998 | Hoffman et al. ............... 203/13 |
| 5,785,820 | A | | 7/1998 | Hoffman et al. ............ 202/158 |
| 5,846,387 | A | | 12/1998 | Hoffman et al. ............... 203/40 |
| 5,950,675 | A | * | 9/1999 | Minami et al. |
| 5,951,779 | A | * | 9/1999 | Koyanagi et al. |
| 5,990,014 | A | * | 11/1999 | Wilson et al. |
| 6,247,838 | B1 | * | 6/2001 | Pozniak et al. |
| 6,290,384 | B1 | | 9/2001 | Pozniak et al. |

FOREIGN PATENT DOCUMENTS

| | | |
|---|---|---|
| EP | 0870535 | 10/1998 |
| EP | 0870729 | 10/1998 |
| WO | WO96/39266 | 12/1996 |
| WO | WO96/39651 | 12/1996 |

* cited by examiner

Primary Examiner—David Sorkin
(74) Attorney, Agent, or Firm—Elwood L. Haynes; Linda K. Russell

(57) ABSTRACT

Provided are a method and apparatus for continuously blending a chemical solution for use in semiconductor processing. The method involves the step of: mixing a first chemical stream with a second chemical stream in a controlled manner, to form a stream of a solution having a predetermined formulation. The apparatus allows one to practice the above method. The method and apparatus can accurately provide chemical solutions of desired concentration in a continuous manner. The invention has particular applicability in semiconductor device fabrication.

23 Claims, 12 Drawing Sheets

METHOD FOR CONTINUOUSLY BLENDING CHEMICAL SOLUTIONS

CROSS REFERENCE TO RELATED APPLICATION

This is a continuation-in-part of application Ser. No. 09/051,304, filed Apr. 16, 1998, U.S. Pat. No. 6,050,283.

BACKGROUND OF THE INVENTION

1. Field of Invention

The present invention relates to novel methods and apparatus for continuously blending a chemical solution for use in semiconductor processing and, more particularly, to their on-site use at a semiconductor manufacturing facility.

2. Description of the Related Art

In the semiconductor manufacturing industry, extensive use is made of liquid chemicals, for example, in wafer cleaning and etching processes. Accurate mixing of reagents at desired ratios is particularly important because variations in concentration of the chemicals introduce uncertainty in etch rates and, hence, are a source of process variation.

Conventionally used chemicals in the semiconductor manufacturing industry which are formed by mixing together two or more chemicals include, for example, hydrofluoric acid (HF), ammonium fluoride ($NH_4F$), hydrochloric acid (HCl), ammonium hydroxide ($NH_4OH$) and nitric acid ($HNO_3$) On-site preparation of such chemicals in ultrapure form is described, for example, in U.S. Pat. Nos. 5,785,820, 5,722,442, 5,846,387, 5,755,934 and in International Publication No. WO 96/39263, the contents of which documents are herein incorporated by reference.

Conventionally, the blending of chemicals is performed by chemical suppliers off-site from the semiconductor manufacturing facility. The chemicals are typically blended through the use of load cells and mixing tanks, with analytical verification. The use of load cells, however, is undesirable for various reasons. For example, piping, which is attached to the weighed mixing vessel, exerts an unpredictable force. This can lead to inaccuracies in measuring the weight of the fluid in the vessel resulting in chemical blends of imprecise formulation.

In addition, expensive electronic equipment is typically required for such known blending processes. The exposure of this equipment to corrosive chemical environments often leads to corrosion and premature failure thereof. Moreover, load cells require the use of additional laboratory instrumentation to determine incoming chemical assay as well as program adjustments to compensate for assay variability.

Upon obtaining a desired chemical formulation, the chemicals are conventionally packaged in totes or drums for shipment to the semiconductor manufacturing facilities. Packaging and storage of the chemicals in this manner is undesirable in that the process of packaging the chemicals and the containers themselves are sources of contamination.

Furthermore, the cost per unit volume of transporting ultrapure chemicals is high. This cost can be especially prohibitive if chemicals of all requisite concentrations are to be shipped. In this regard, the conventionally used chemicals, such as hydrofluoric acid, are often employed at various dilutions in the semiconductor manufacturing process. Chemical shipment is particularly inefficient with very dilute acids.

Once at the semiconductor manufacturing site, the chemicals are stored until used. Such storage, however, is not particularly desirable, as considerable space is required and costs are incurred due to storage and management of the totes in the manufacturing facility.

In addition, the chemicals are often unstable and therefore have limited shelf lives. High purity water ("deionized" or "DI" water), typically employed in the manufacture of chemicals, exhibits organic growth after short periods of time. Hence, it is not uncommon for the shelf life of a chemical to expire prior to use. The unused chemical must therefore be disposed of, resulting in economic loss as well as environmental issues associated with waste disposal.

To address the problems associated with the processing of chemicals off-site from the point-of-use, on-site blending methods and apparatus have been proposed for semiconductor applications. An on-site blending method is described, for example, in International Publication No. WO 96/39651, the contents of which are incorporated herein by reference. An exemplified embodiment of that document involves a batch-type process, with mixing of the components taking place in a single blender tank. After mixing two chemicals in the blender tank to a desired endpoint, those chemicals are shut off. A third chemical is next introduced into the tank to a desired endpoint.

One of the disadvantages associated with such a batch-type process is that it is difficult to achieve steady state conditions and the desired chemical formulation in a small amount of time. In addition, it is necessary with the batch-type process that a supply of the blended chemical be stored in a tank or other container to avoid production down time if the chemical should become depleted. The use of a storage container, however, is undesirable at least due to its space and management requirements.

To meet the requirements of the semiconductor manufacturing industry and to overcome the disadvantages of the related art, it is an object of the present invention to provide novel methods for continuously blending a chemical solution. The invention allows for real time, precise control of chemical formulations by continuous monitoring and flow-rate adjustment of the chemicals employed. The desired formulations can be achieved in a fast and facile manner from startup based on calibration data stored in one or more controllers.

Furthermore, total cost associated with the chemicals can be significantly reduced since only concentrated acids, and not dilute solutions, need be shipped to the end user's site. This renders unnecessary the need to inventory and handle large volumes of dilute chemicals. In addition, the costs and time associated with laboratory analytical verification can be avoided or minimized, since the process is calibrated to analytical analysis at the time the process is set up and only periodically thereafter to ensure continued calibration accuracy.

It is a further object of the invention to provide methods of continuously blending a chemical solution on-site at a semiconductor manufacturing facility.

A further object of the present invention is to provide a novel apparatus for continuously blending a chemical solution.

It is a further object of the invention to provide an apparatus for continuously blending a chemical solution on-site at a semiconductor manufacturing facility.

Other objects and aspects of the present invention will become apparent to one of ordinary skill in the art on a review of the specification, drawings and claims appended hereto.

BRIEF DESCRIPTION OF THE DRAWINGS

The objects and advantages of the invention will become apparent from the following detailed description of the preferred embodiments thereof in connection with the accompanying drawings, in which.

SUMMARY OF THE INVENTION

In accordance with the present invention, innovative methods and apparatus for continuously blending chemical solutions are provided. The invention finds particular applicability in the semiconductor manufacturing industry, wherein chemical solutions of desired formulations can be generated on-site, with the resulting chemical being introduced directly into one or more semiconductor processing tools. Of course, the resulting chemical employed can be in the form of aqueous solutions.

According to a first aspect of the invention, a method of continuously blending a chemical solution for use in semiconductor processing is provided. The method comprises the step of mixing a first chemical stream with a second chemical stream in a controlled manner, to form a stream of a solution having a predetermined formulation.

According to a further aspect of the invention, a method of continuously blending a chemical solution for use in semiconductor processing is provided. The method comprises the steps of:

(a) mixing a first chemical with a second chemical in a controlled manner to provide a first solution having a predetermined formulation; and (b) mixing a third chemical with the first solution in a controlled manner to provide a second solution having a predetermined formulation.

Steps (a) and (b) are performed contemporaneously.

In accordance with a further aspect of the invention, a method of continuously blending a chemical solution on-site at a semiconductor manufacturing facility is provided. The method comprises the steps of:

(a) mixing a first chemical with a second chemical in a controlled manner to provide a first solution having a predetermined formulation; and (b) mixing a third chemical with the first solution in a controlled manner to provide a second solution having a predetermined formulation; and (c) introducing the blended solution into a semiconductor processing tool, wherein steps (a) and (b) are performed contemporaneously.

In accordance with yet a further aspect of the invention, an apparatus for continuously blending a chemical solution for use in semiconductor processing is provided. The apparatus comprises a first chemical source, a second chemical source and a third chemical source connected by a conduit system to allow a stream of the first chemical to be mixed with a stream of the second chemical to form a first solution, and a stream of the first solution to be mixed with a stream of the third chemical to provide a second solution. The first and second solutions are provided contemporaneously. Means for controlling the formulations of the first and second solutions are provided.

In accordance with a further aspect of the invention, an apparatus for continuously blending a chemical solution on-site at a semiconductor manufacturing facility is provided. The apparatus comprises a first chemical source, a second chemical source and a third chemical source connected by a conduit system to allow a stream of the first chemical to be mixed with a stream of the second chemical to form a first solution, and a stream of the first solution to be mixed with a stream of the third chemical to provide a second solution. The first and second solutions are provided contemporaneously. Means for controlling the formulations of the first and second solutions are provided. A semiconductor processing tool is connected to receive the blended solution.

In accordance with a further aspect of the invention, an apparatus for continuously blending a chemical solution for use in semiconductor processing is provided. The apparatus comprises a first chemical source and a second chemical source connected by a conduit system to allow a stream of the first chemical to be mixed with a stream of the second chemical to form a solution, and means for controlling the formulation of the solution.

DETAILED DESCRIPTION OF THE PREFERRED EMBODIMENTS OF THE INVENTION

The invention will be described with reference to FIG. 1, which illustrates a process flow diagram of a system 100 for continuously blending chemical solutions in accordance with one exemplary aspect of the invention. The chemical solution is formed by mixing together any number of chemicals in a controlled manner to achieve a final solution of desired concentration.

If the chemical solution is to be used in the manufacture of electronic devices, the starting materials are preferably of ultrapure quality, preferably less than 1 ppb impurities. This will help to ensure a final chemical purity which also is ultrapure, and thus not detrimental to the devices being formed. The starting chemicals are typically in liquid form. However, gases may be employed, for example, by bubbling the gas into a liquid chemical.

Typical combinations of chemicals used in semiconductor fabrication which may be applied to the invention include, for example, the following: deionized water, hydrofluoric acid (HF), nitric acid ($HNC_3$) and acetic acid ($CH_3COOH$); deionized water, hydrofluoric acid and ammonia ($NH_3$), to form ammonium fluoride ($NH_4F$); deionized water, potassium hydroxide (KOH) and ethylene diamine (EDA); and deionized water, ammonium hydroxide ($NH_4OH$) and a surfactant, to form a block cleaning solution (BCS). Other combinations of the above or different chemicals or gases that are soluble in solution, would be understood by persons of ordinary skill in the art to be within the scope of the invention.

A partial list of conventional chemicals that can be generated on-site at the semiconductor fabrication facility includes at least the hydrofluoric acid, buffered hydrofluoric acid, hydrochloric acid and ammonia.

For purposes of the present invention, it is convenient to classify the chemicals being mixed into two groups, i.e., ionic and non-ionic chemicals. This allows for the selection of an appropriate concentration sensor for the chemicals being blended. For concentration measurement of an ionic solution, a conductivity sensor, such as an electrodeless conductivity sensor employing AC toroid coils, or an acoustic signature sensor can be employed. Concentration measurement in non-ionic solutions can be accomplished with an acoustic signature sensor.

Electrodeless conductivity systems measure the conductance in a solution by inducing an alternating current in a closed loop and measuring its magnitude. An electric current may be caused to flow in an electrolyte by means of induction. The electrodeless system contains an electrolyte which flows in an electrically insulating tube that surrounds two coils in a fashion that the electrolyte forms a closed loop linking the flux in both cores. These coils serve as a primary and secondary winding, and they are toroidal. Additionally, both windings are housed in the same encapsulation. The first toroidal coil serves as a single turn secondary winding in which an alternating voltage is induced. The second toroidal coil serves as a single turn primary winding in which the loop forms. This provides a means for measuring the resulting current, which is directly proportional to the specific conductance of the electrolyte comprising the loop. Suitable AC toroid coil sensors are commercially available from, for example, a model 3700 series electodeless sensor provided by GLI International.

Acoustic signature sensors are commercially available, for example, from Mesa Laboratories, Inc., Nusonics Division, Colorado, and are described generally in International Publication No. WO 96/39263. Such sensors include an ultrasonic generator and a transducer. An acoustic sound wave or pulse is propagated through the solution and its velocity, i.e., the time of flight, is measured. The sound velocity through the solution is directly related to the solution temperature and to the concentration of the chemicals in the solution or, more appropriately, the volume ratio of the chemicals.

The system includes a conduit system interconnecting the various components of the system. A first chemical source 102, a second chemical source 104 and a third chemical source 106 are provided. The first, second and third chemicals are introduced into the system through conduits 108, 115 and 117, respectively. As illustrated, the first chemical can be deionized water which is conventionally produced by a central generation system. The flow rate of first chemical 102 into the system can be controlled by a regulation device (not shown) or pneumatic valve 114. The second and third chemicals are typically stored in a reservoir (not shown), and are fed into storage tanks 160, 162 through conduits 115, 117 which include valves 119, 121. These second and third chemicals which are dosed in to the main stream include a backpressure regulator (not shown) disposed between the metering pump and the stream. The storage tanks can include vents 118, 120 for exhausting the headspace under a nitrogen blanket so as not to contaminate the ultrapure chemicals therein.

Chemical levels in the storage tanks can be maintained within predefined limits by known methods and apparatus, which can include maximum and minimum level sensors 122, 124, 156, 158 and one or more controllers which operate valves 119, 121 on inlet conduits 115, 117. The controllers are pre-programmed with minimum and maximum set-point levels with which the actual measured levels are compared. If the liquid level reaches the minimum set-point level, valve 119 or 121 is opened, allowing more of the chemical to be introduced into the storage tank. The flow of the chemical into the storage tank is shut off by closing valve 119 or 121 when the maximum set-point level in the tank is reached. Other variations to control liquid level are known to those skilled in the art.

The storage tanks 160, 162 are each connected to main conduit 108 by a conduit 110, 112. To regulate the flow of the second and third chemicals into the main conduit 108 and through the system, dosing pumps 130, 132 are provided in conduits 110, 112 downstream from the storage tanks. Dosing pumps 130, 132 are preferably electro-magnetic drive pumps with a variable signal to increase and decrease the pump stroke frequency. The dosing pumps are connected to a control system described below which controls the flowrate of the second and third chemicals into the system. Among the commercially available controllers, computers or proportional integral derivative instruction devices with a feed-back or feed-forward control algorithm are preferred.

The first chemical 102 and second chemical 134 contact each other and are mixed in a mixing zone 136 in the conduit system. The mixing zone preferably includes mixing means, which can include, for example, stirrers, baffles, a vortex breaker or the like, sufficient to mix the chemicals such that a homogeneous solution is obtained. In the case in which a gas is to be bubbled into a liquid, the mixing means can include, for example, a sparger.

Following the mixing step, the homogeneous first solution is directed to first concentration sensor 140. As described above, the sensor can be a conductivity or acoustic signature sensor for an ionic solution, or an acoustic signature sensor for a non-ionic solution. Based on the measurement obtained with the first sensor, the flowrate of the first chemical or second chemical is automatically adjusted and controlled such that the proper formulation of the first solution is obtained.

Preferably, the system comprises a closed-loop control system, in which a signal from the sensor 140 based on the measurement is directed to a controller 142. The controller 142 then sends a signal to the flow control valve 114 or dosing pump 130 to control the flow of the first or second chemical via a feed-back algorithm to arrive at the requisite concentration of the first solution. To minimize the number of runs and time required to reach the desired concentration, controller 142 can be programmed to retain the process settings from the previously formed solution.

Contemporaneous with the introduction of the first and second chemicals into main conduit 108, the third chemical is continuously introduced into the main conduit 108 via line 112, downstream of first sensor 140. The third chemical is mixed with the first solution in a second mixing zone to form a second solution. To ensure homogeneity of the second solution, the second mixing zone preferably includes mixing means as described above with reference to the first mixing zone.

Following the mixing step, the homogeneous, second solution is directed to second concentration sensor 146. As described above, the sensor can be a conductivity or acoustic signature sensor for an ionic solution, or an acoustic signature sensor for a non-ionic solution. Based on the measurement obtained with the second sensor 146, the flowrate of the first solution or the third chemical is adjusted such that the proper formulation of the second solution is obtained.

The flowrate of the first solution can be controlled via control valve 148 disposed downstream from the first sensor and upstream from the point at which the first solution and third chemical are mixed. If the flowrate of the third chemical is to be controlled, the controller 142 can automatically regulate the output dosing pump 132. The control system described above with reference to the blending of the first solution is equally applicable to the second solution, and the same or a different controller from that used for blending the first solution can be employed.

Until the predetermined formulation is obtained for both the first and second solutions, valve 152 which connects the blending system to the point of use remains closed, and valve 150 which connects the blending system to waste is opened. Upon arriving at the desired concentration of the second solution, valve 150 is closed and valve 152 is opened, allowing the blended solution to be directed to the point of use, for example, to a semiconductor processing tool.

Prior to performing the blending method in accordance with the invention, the first and second sensors are calibrated for the specific chemicals and solutions being blended. Conductivity sensors are calibrated, in a manner well know in the industry. Initially, a zero point of the electrodeless conductivity sensor or acoustic signature sensor is attained by exposing the sensor to air until the sensor is entirely dry and the offset is adjusted until a 0.000 mS/cm conductivity is attained. Of course, the measure of conductivity may be expressed in other units such as $\mu$S/cm or S/cm.

Upon attaining the zero point, the sensor is placed in a solution of know concentration and the conductivity is measured at a series of different temperatures. The solutions' concentration may be verified by standard titration methods. Resulting concentration values are entered into controller or analyzer 142 employed to continuously monitor and adjust dosing pumps 130, 132.

Alternatively sensors 140, 146 may be calibrated by the "Grab Sample Method." The sensors are placed on the main conduit 108 and a solution of known conductivity and assay is passed therethrough. Conductivity readings that are calibrated are taken and stored into controller 142.

Subsequent to calibrating the concentration sensors, the conductivity of each solution to be run through the system is calibrated in part. Each individual solution to be transmitted in the system is conveyed through a concentration sensor and a correlation between the sensor reading and the actual solution is carried out. To ensure correct readings the solution is verified by titration or other methods. From this data a plot of sensor reading versus actual concentration is generated. Temperature variations in the solution are accounted for, and a corresponding correction may be made by controller 142.

Following the first and second solution calibration conductivity data points are entered into controller 142, and employed to adjust the metering of pumps 130 and 132, to arrive at the conductivity desired. As explained above, the conductivity correlates to the percent weight assay of the chemicals introduced.

While the exemplary embodiment described above with reference to FIG. 1 involves at least two chemicals and a blending step, the present invention is in no way limited thereto. The invention can readily be applied to the blending of as few as two chemicals in a single blending step, or with a single sensor any number of additional chemicals in the manner described above. For each additional chemical introduced into the mixture, an additional blending step and sensor are required.

Figure 2:
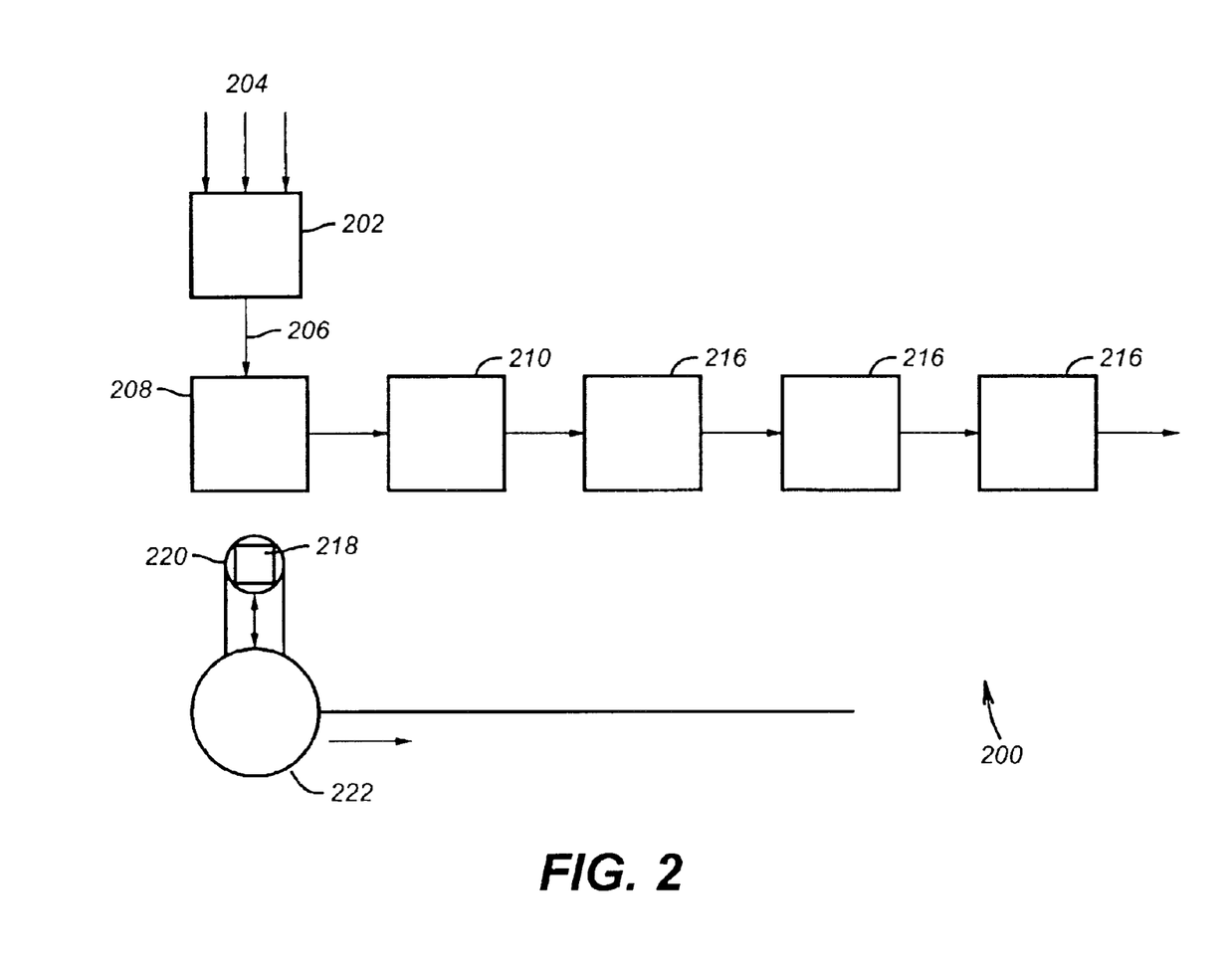
FIG. 2 is a process flow diagram of an apparatus for continuously blending solutions connected to supply the blended solution to a semiconductor processing tool, in accordance with a further exemplary aspect of the invention.

FIG. 2 illustrates a system 200 which includes one or more apparatuses 202 as described above for continuously blending solutions, as well as one or more semiconductor processing tools connected to receive the blended solutions. Starting chemicals 204 are introduced into blending apparatus 202, which forms blended solution 206.

The processing tools can include, for example, one or more wet processing stations for cleaning and/or etching semiconductor wafers, as well as auxiliary stations, for example, a drying station. As illustrated, the treatment stations include a cleaning station 208, a first rinse station 210, a deglaze station 212, a final rinse station 214 and a dryer 216.

Cleaning station 208 is connected by a conduit to receive the blended solution formed by blending apparatus 202. This solution can be, for example, a dilute hydrofluoric acid cleaning solution, formed by blending deionized water with concentrated hydrofluoric acid to form a first solution, and blending the first solution with a surfactant to form the cleaning solution. First and second rinse stations 210, 214 contain ultrapure deionized water, and deglaze station 212 contains, for example, a buffered hydrofluoric acid cleaning solution.

The one or more semiconductor wafers 218 are held on a wafer support or in a cassette 220. The wafers together with the support or cassette are conveyed between the workstations by a robotic transfer mechanism 222 or other conventional means of conveying such objects between the stations. While wafer transfer can be performed manually, the means for conveyance is preferably totally or partially automated.

First, the wafers are introduced into cleaning station 208 to remove contaminants from the wafers. The wafers are then removed from cleaning station 208 and transferred into first rinsing station 210 wherein the wafers are rinsed with deionized water to remove residual cleaning solution from the wafer surfaces. The wafers are next transferred into deglaze station 212 for the removal of native or other oxide films from the wafer surface. The wafers are then introduced into final rinse station 214 and finally to dryer 216. The wafers are removed from the dryer and sent to subsequent processes to complete the device fabrication process.

It should be noted that the number or types of blending systems and treatment stations, as well as the types of chemicals employed, are not limited in any way to those discussed above with reference to the exemplary embodiment. In general, wet treatment operations in semiconductor manufacturing processes may vary widely from that illustrated in FIG. 2, either by eliminating one or more of the units shown or by adding or substituting units not shown. Persons of ordinary skill in the art can readily adapt the present invention to any such operations.

The following examples are provided to illustrate generations of an ultrapure solution formed by combining deionized water, ethylene diamine (EDA) and potassium hydroxide (KOH) according to one aspect of the invention and an ultrapure solution formed by combining deionized water with ammonium hydroxide and surfactant according to another aspect of the invention.

EXAMPLE 1

A continuous blending apparatus as described above with reference to FIG. 1, configured with two AC toroid coils, was employed to blend a solution made up of deionized water, ethylene diamine (EDA) and potassium hydroxide (KOH). Prior to mixing the chemicals, the sensors were calibrated to a "zero point" as described above.

Figure 3:
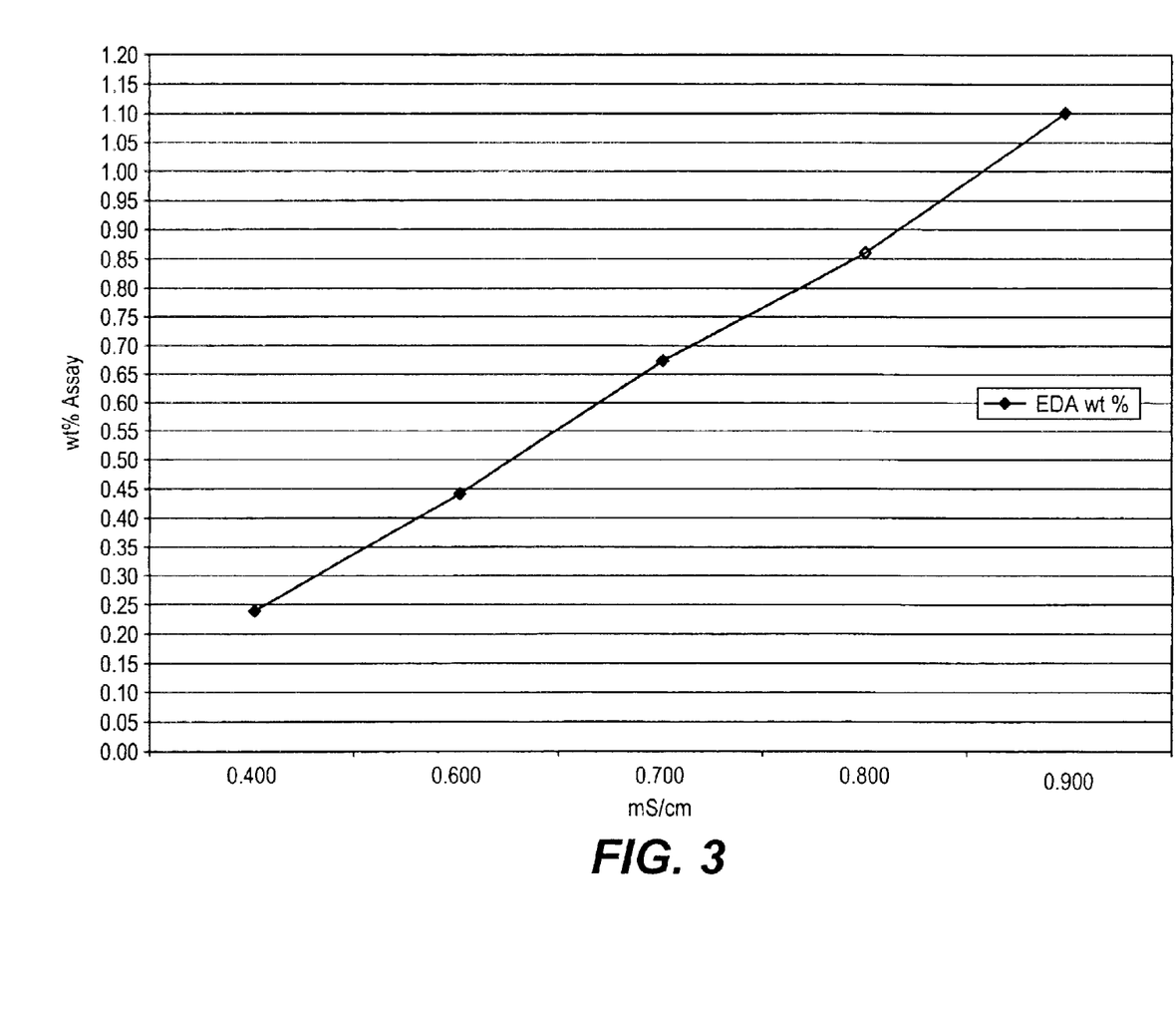
FIG. 3 is a graph of weight assay percent of EDA versus conductivity in a accordance with Example 1 of the invention.
Figure 4:
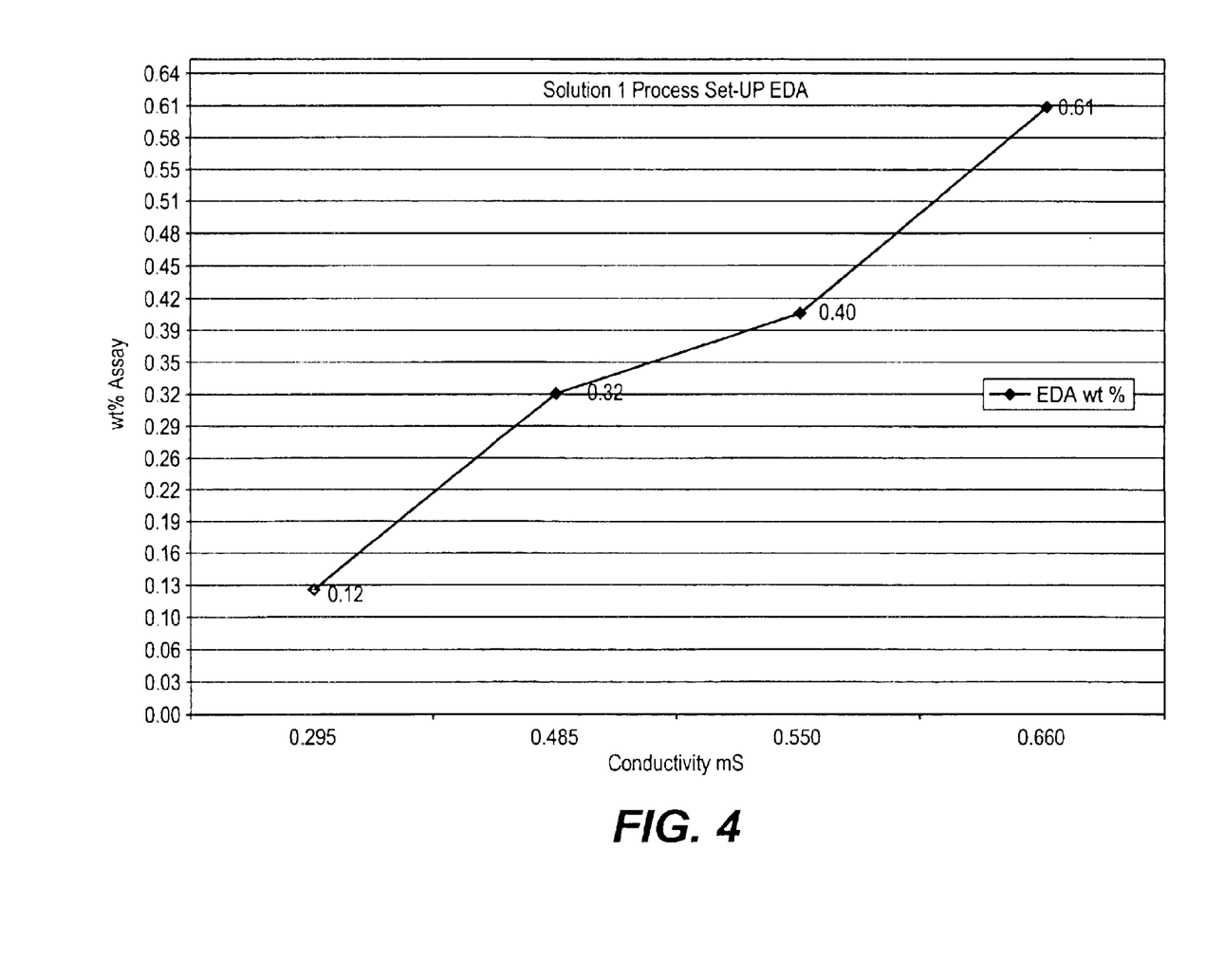
FIG. 4 is a graph of wight assay percent of EDA versus conductivity at process set-up in accordance with Example 1 of the invention.
Figure 5:
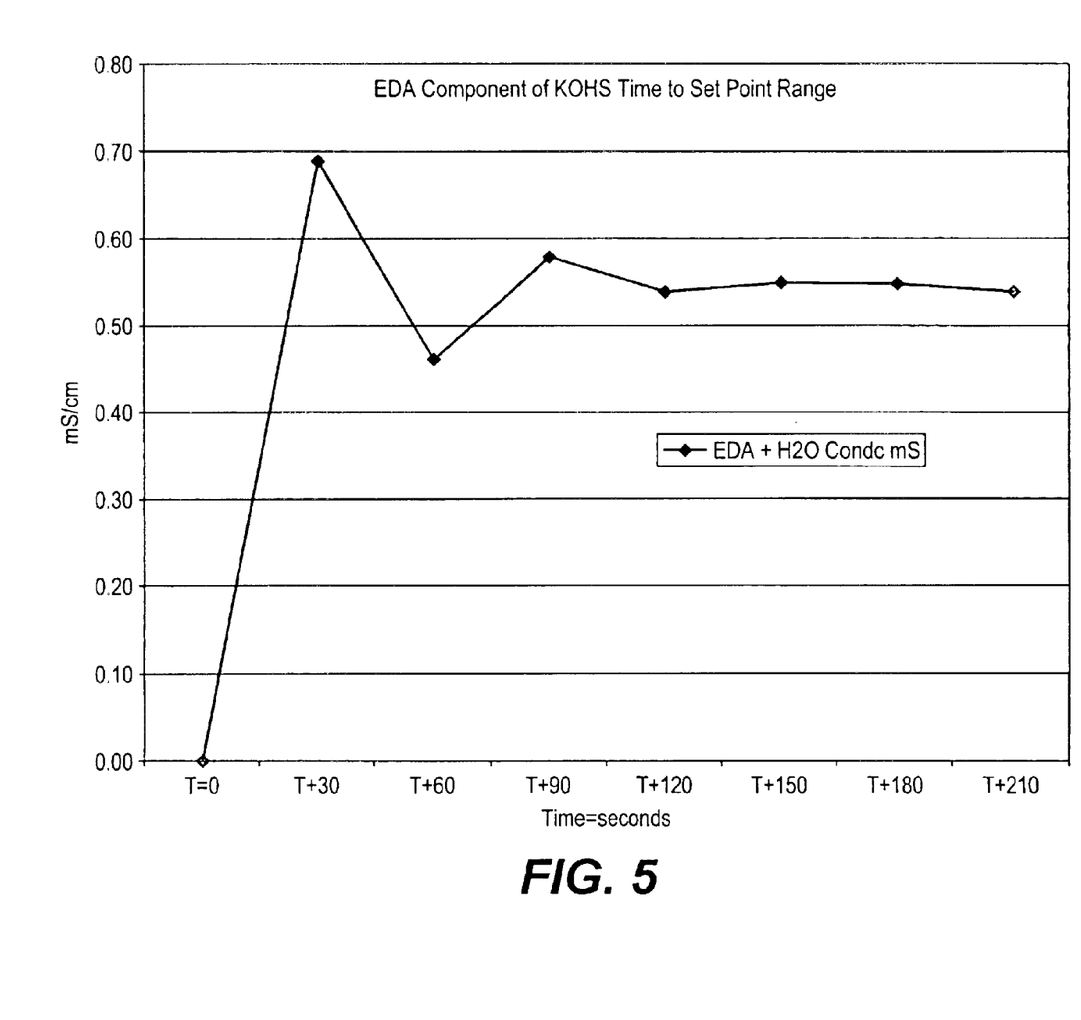
FIG. 5 is a graph of conductivity versus time to exhibit the length of time need to bring the EDA component to specification in accordance with Example 1 of the invention.

The operating parameters are established for the requisite first solution as shown in FIG. 3, where the conductivity is determined at different weight percent assay of EDA mixed with deionized water. The concentration values obtained are verified by titration and the conductivity values are entered on display 154 of controller 142. As the first solution of EDA is passed through conduit 108 to sensor 140 an assay wight percent vs. conductivity correlation chart is generated showing the EDA range to be run. See FIG. 4. Thus, to obtain a flow rate of 0.40% by weight of ethylene diamine assay in the first solution a conductivity of 0.551 mS/cm must be attained. A signal is sent from controller 142 adjusts the flow of dosing pump 130 based on conductivity. As illustrated in FIG. 5, the solution is brought to specification in approximately 60 seconds.

Figure 6:
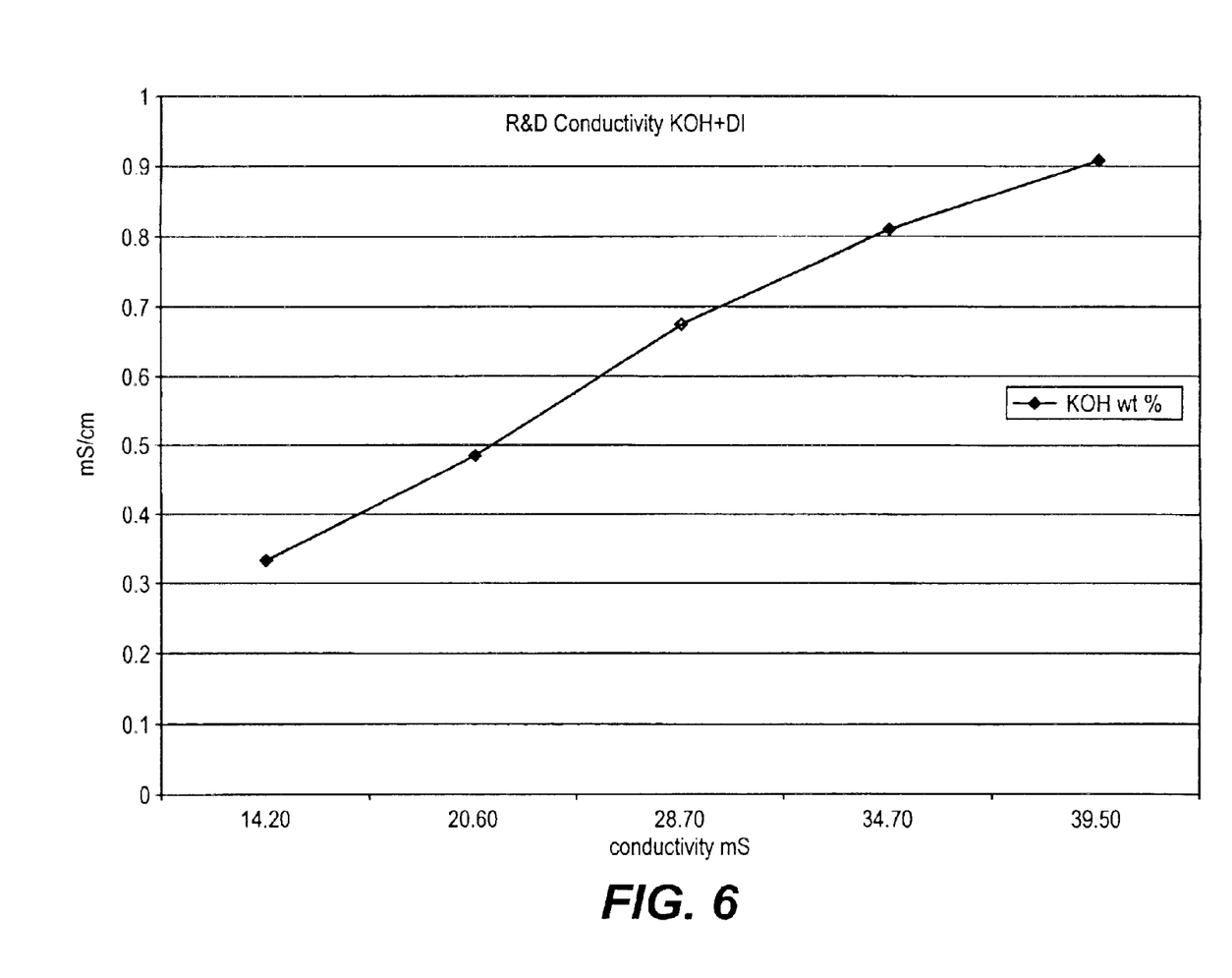
FIG. 6 is a graph of weight assay percent of KOH versus conductivity in a accordance with Example 1 of the invention.
Figure 7:
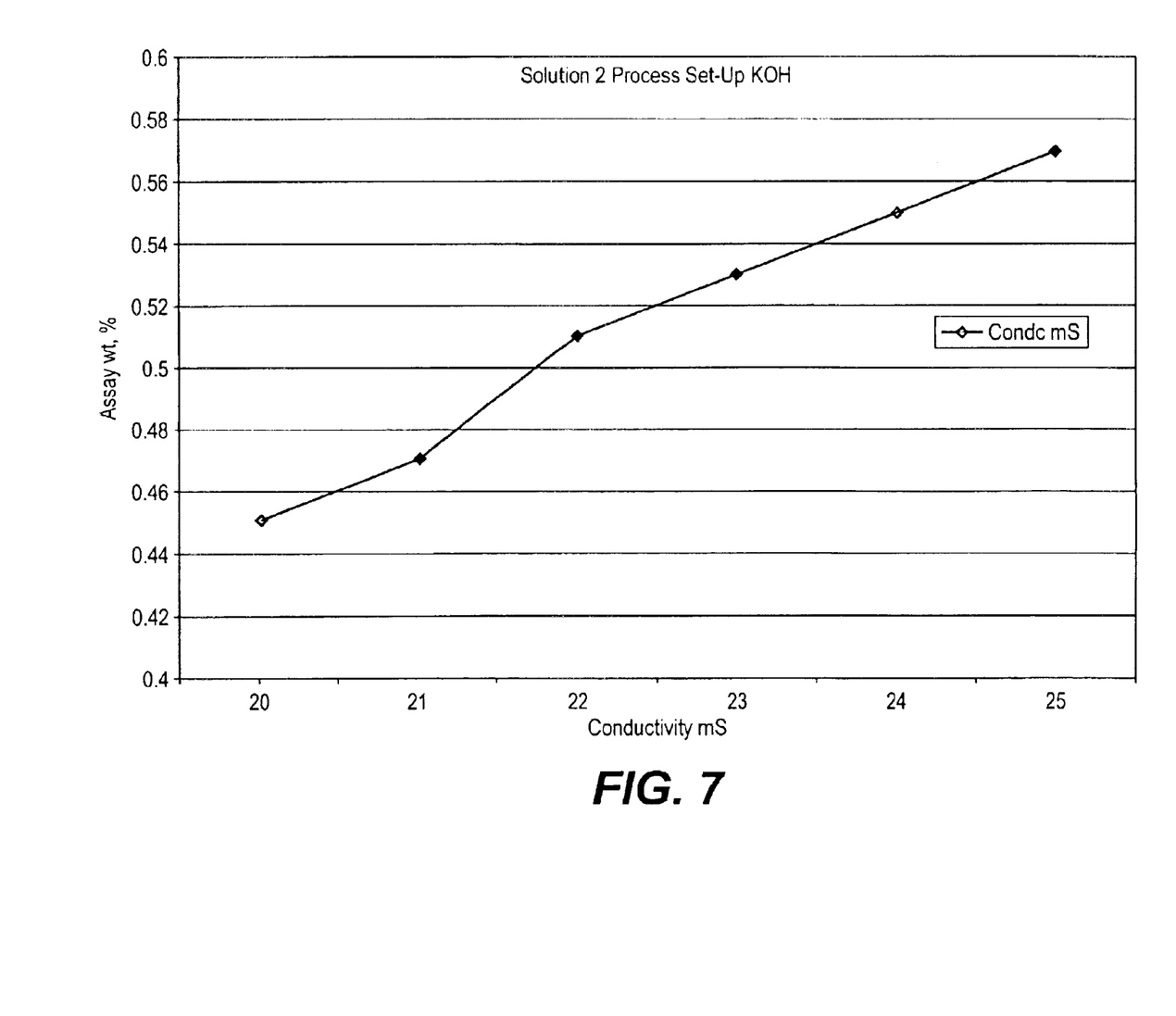
FIG. 7 is a graph of weight assay percent of KOH versus conductivity at process set-up in accordance with Example 1 of the invention.
Figure 8:
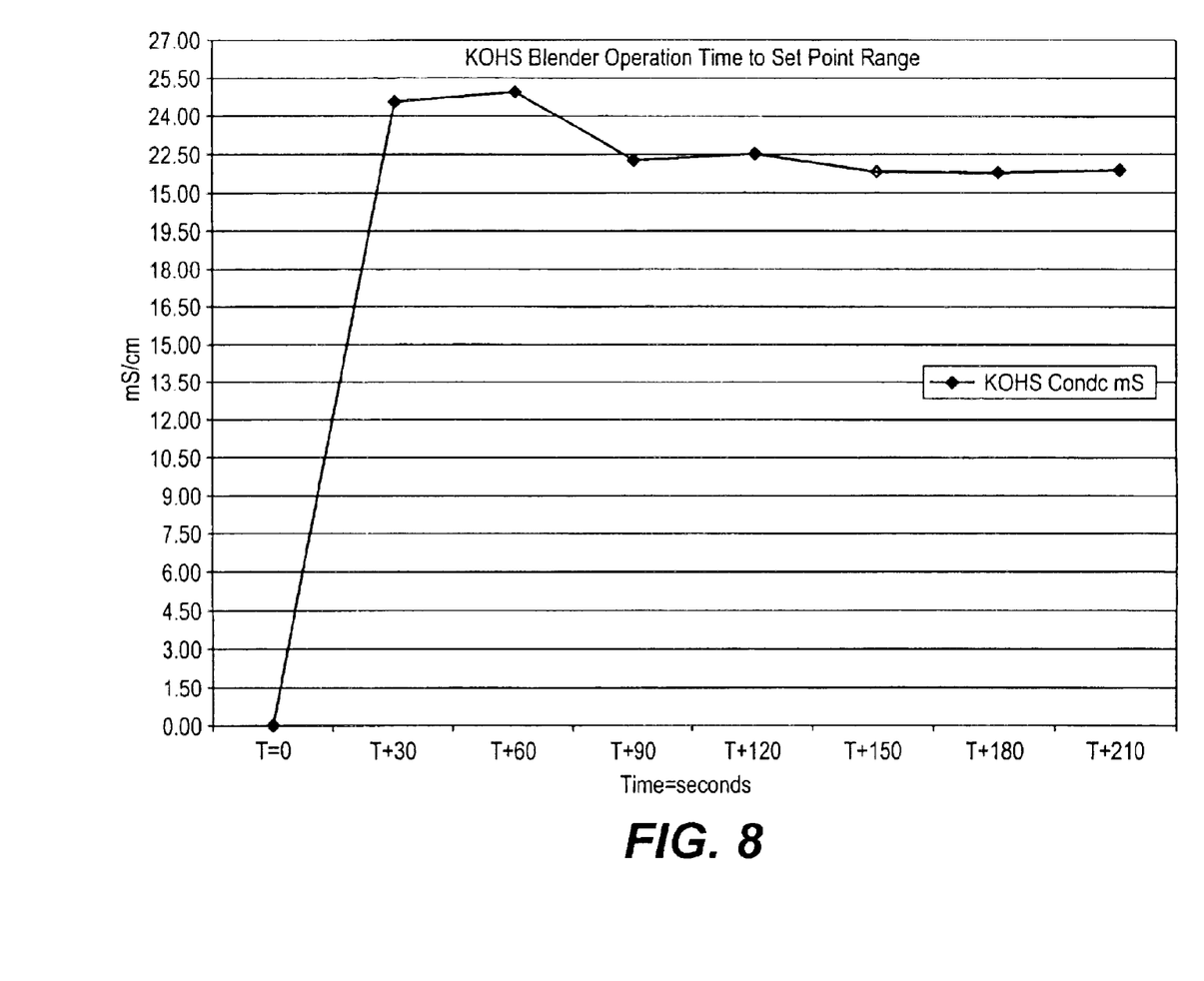
FIG. 8 is graph of conductivity versus time to exhibit the length of time need to bring the KOHS blender to specification in accordance with Example 1 of the invention.

Subsequently, the operating parameters for a solution of KOH and deionized water is carried out in the same manner, as described above with respect to the first solution. Note FIGS. 6–8.

Thereafter, the first and second solution concentration is derived by an equation in controller 142, which proportionally increases or decreases the amount of second or third chemical 134, 136 injected into the first chemical stream 102 based on the conductivity value set point. The amount of either chemical injected by dosing pump 130, 132 is adjusted by controller 142 in response to the conductivity value obtained from the sensors. Thus, a second solution having 0.50 weight percent potassium hydroxide assay is added to a first solution having 0.40 weight percent ethylene diamine establishes a conductivity 21.98 mS/cm. It is noted that this conductivity value is less than in the second solution having 0.50 weight percent of potassium hydroxide in water. Therein, the conductivity measurement is 22.03 mS/cm.

Figure 9:
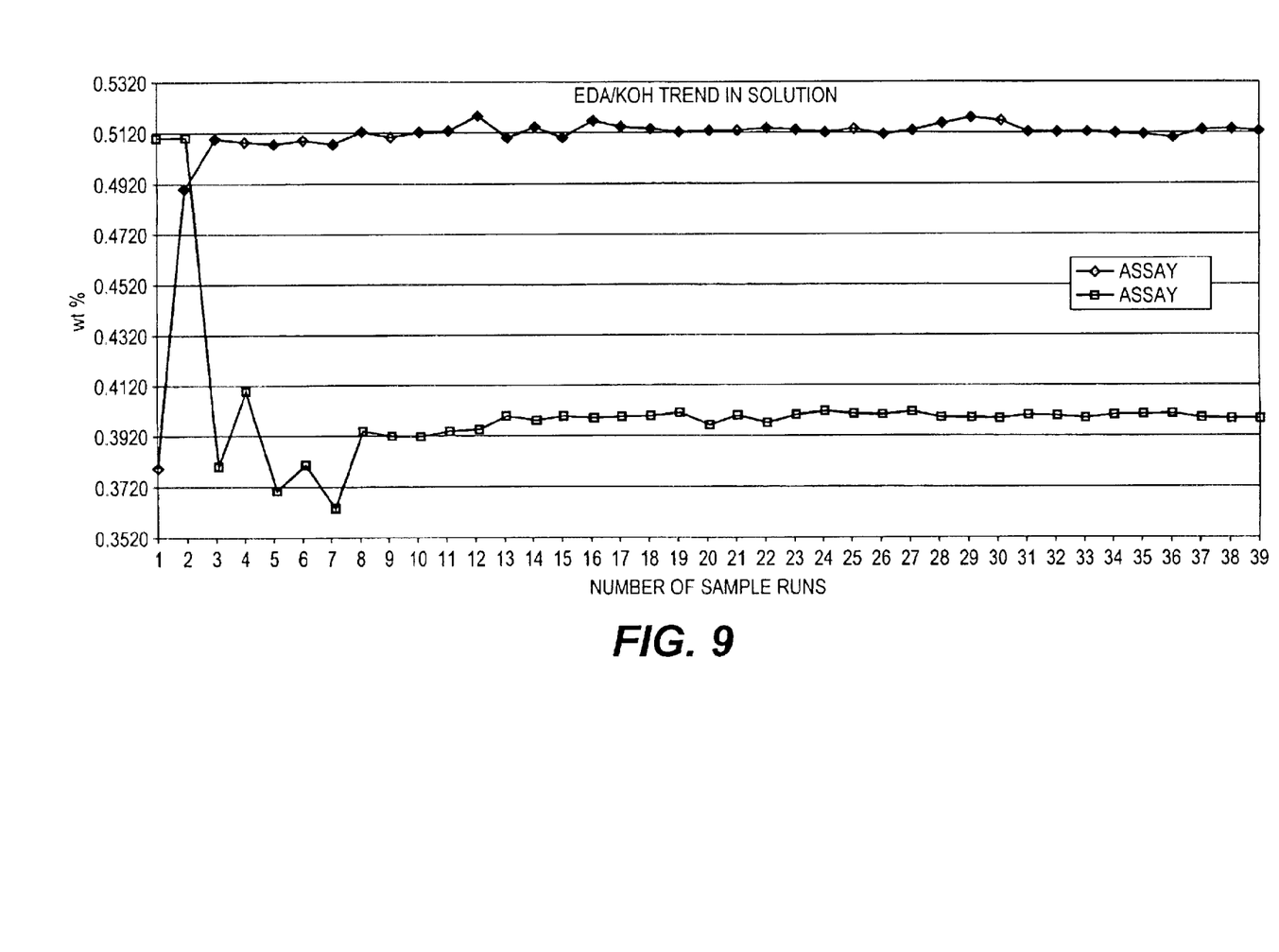
FIG. 9 is a graph of weight percent KOH and weight percent EDA in a blended solution, formed in accordance with an exemplary aspect of the invention, versus sample number.

FIG. 9 is a graph of weight percent KOH in the first solution and weight percent EDA in the second solution versus sample number. It can be seen that the solution reached the target concentrations by the seventh sample run, and thereafter the process runs were easily reproduced. The produce solution was found to be very stable, with little adjustment of the dosing pumps being required thereafter.

EXAMPLE 2

Figure 1:
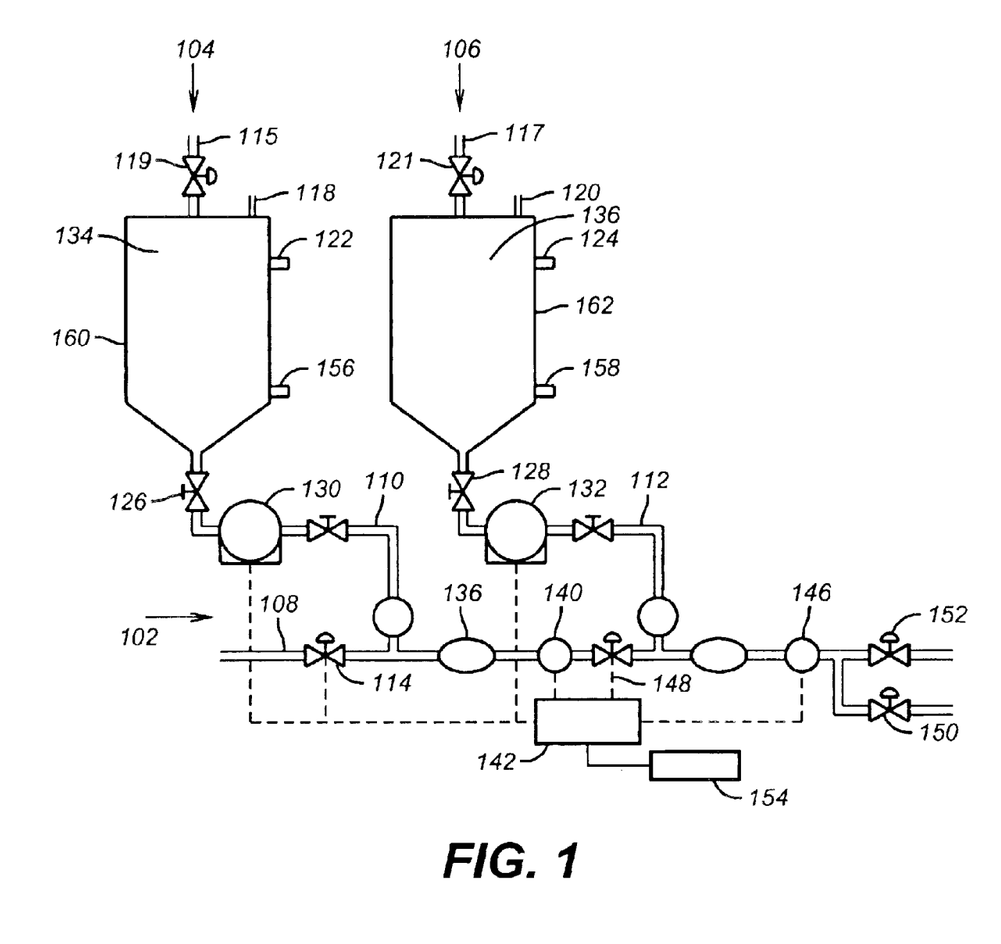
FIG. 1 is a process flow diagram of an apparatus for continuously blending solutions in accordance with one exemplary aspect of the invention.
Figure 10:
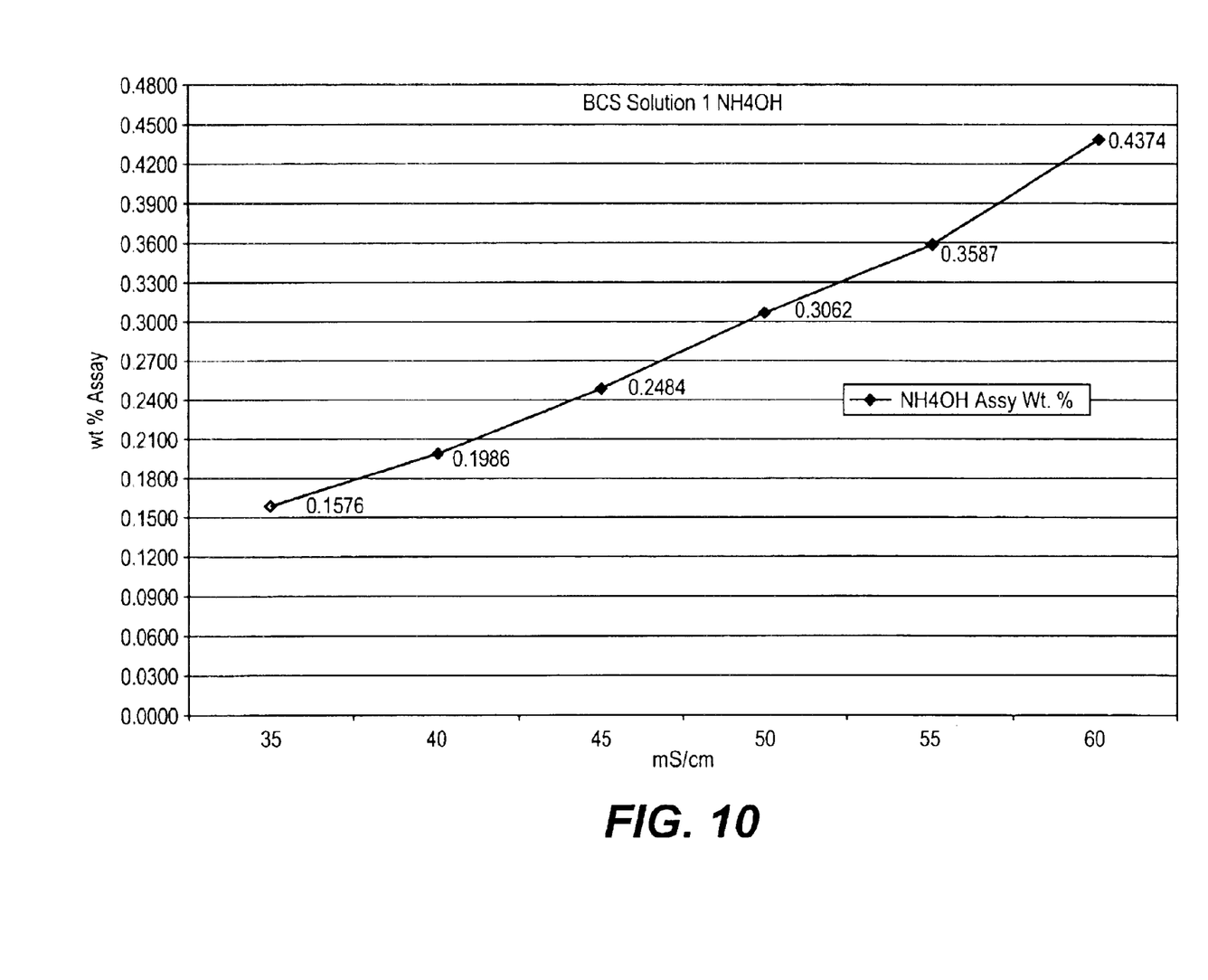
FIG. 10 is a graph of weight assay percent of $NH_4CH$ versus conductivity in a accordance with Example 2 of the invention.
Figure 11:
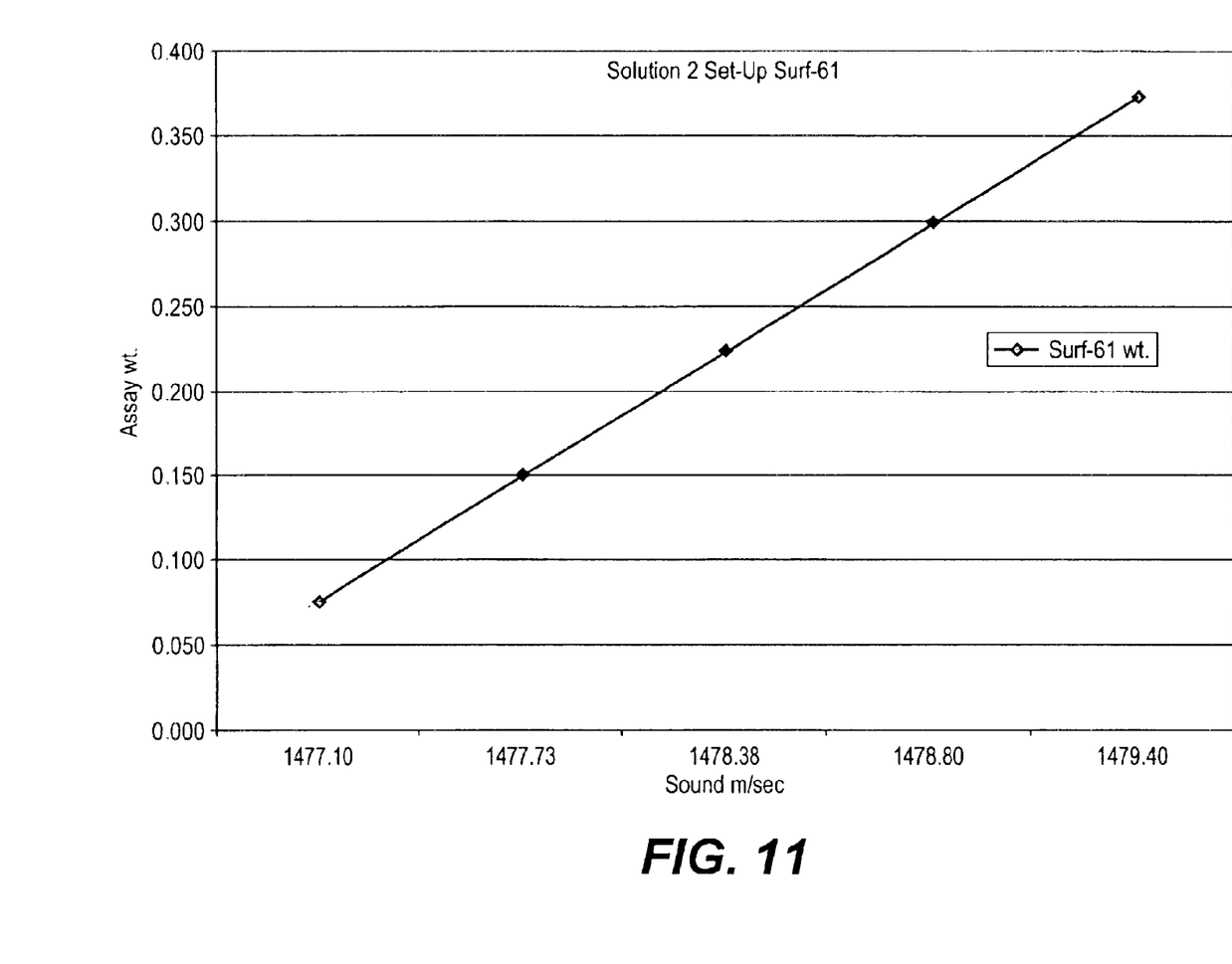
FIG. 11 is a graph of weight assay percent of surfactant versus conductivity at process set-up in a accordance with Example 2 of the invention.

A continuous blending of ionic and non-ionic chemicals is performed with reference to FIG. 1, wherein sensor 140 is a toroid coil conductivity sensor and sensor 146 is an acoustic signature sensor. An ionic ammonium hydroxide chemical is added to a deionized water chemical to form a first solution. The solution is calibrated as mentioned above in regard to Example 1, by correlating the percentage weight assay with the conductance of the solution. Note FIG. 10. Subsequently, a similar procedure is carried out with respect to a non-ionic surfactant solution. The values obtained are depicted in FIG. 11.

Figure 12:
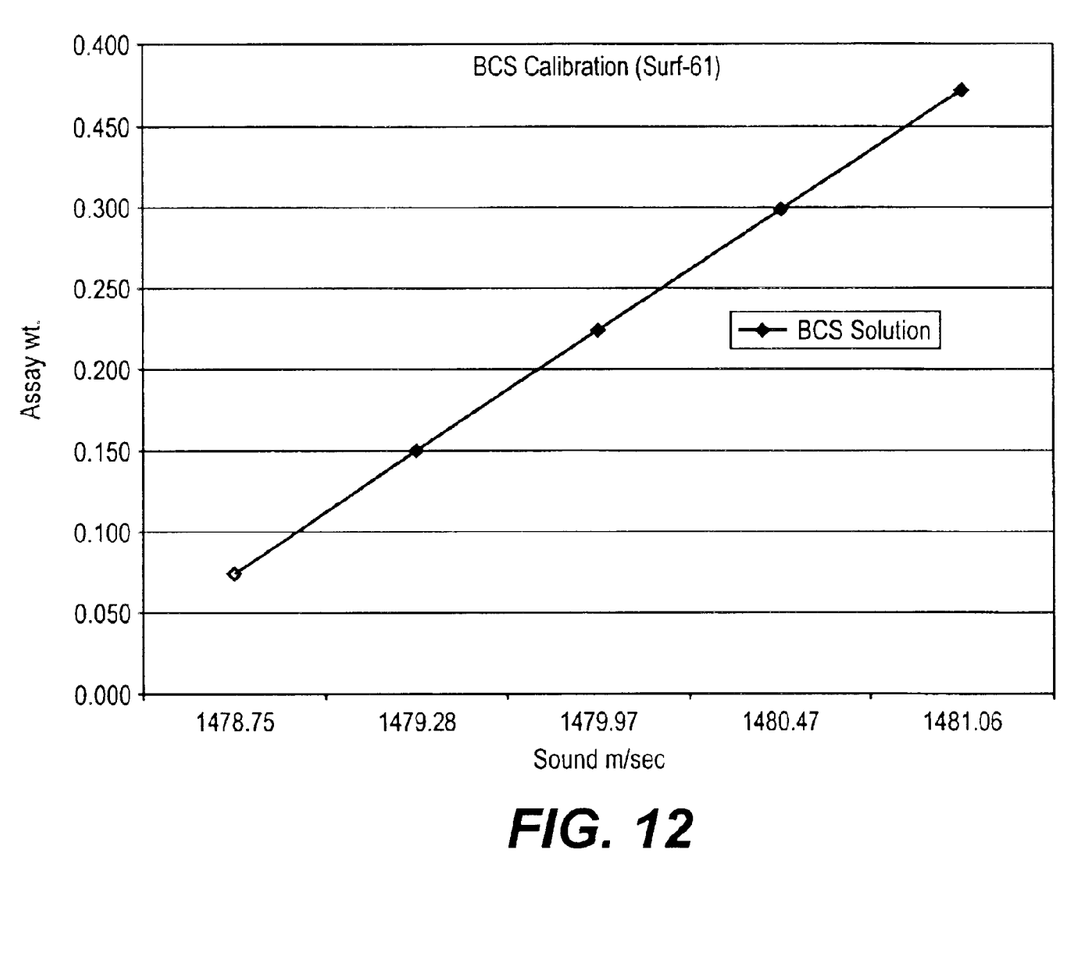
FIG. 12 is graph of weight percent assay versus sonic velocity ranges to exhibit the length of time need to bring the block cleaning solution to specification in accordance with Example 2 of the invention.

A second, product block cleaning solution is formed by adding a third non-ionic surfactant to the first solution. Dosing pump 132 is adjusted by an equation determined by controller 142 to reach a set point value. Thus, controller 142 proportionally increases or decreases the amount of chemical 136 added based on the conductivity reported by sensor 146. As a result, a desired third chemical assay is attained in the second solution based on the ratio of the third chemical component to that of the first two chemical components as determined through conductance. See FIG. 12.

The assay of the product is verified by analytical analysis for verification of the process. Process assay trends are monitored on display 154 of controller 142 and are actively adjusted based on the concentration desired. On entering the requisite ionic concentration for a certain application, and based on the conductivity reading of the concentration sensors, controller 142 adjusts the flow of the dosing pumps thereby calibrating the assay of each component to maintain the desired concentration.

While the invention has been described in detail with reference to specific embodiments thereof, it will be apparent to one skilled in the art that various changes and modifications can be made, and equivalents employed without departing from the scope of the claims.

What is claimed is:

1. A method of continuously blending a chemical solution for use in semiconductor processing, comprising:
   mixing continuously a first chemical stream with a second chemical stream in a mixing zone in a conduit system and in a real time controlled manner forming a solution having a predetermined formulation, wherein the first chemical stream and the second chemical stream are continuously introduced to the mixing zone;
   adjusting continuously the flowrate of the first chemical and the flowrate of the second chemical;
   monitoring continuously the solution; and
   introducing the solution having a predetermined formulation into a semiconductor processing tool.

2. The method according to claim 1, wherein the flowrate of the first chemical or the flowrate of the second chemical is controlled in response to a signal generated by a sensor which monitors the solution.

3. The method according to claim 2, wherein the sensor is selected from a group consisting of conductivity and acoustic signature sensors.

4. The method according to claim 3, wherein the solution is ionic, and the sensor is a conductivity sensor.

5. The method according to claim 4, wherein the conductivity sensor is an electrodeless conductivity sensor employing AC toroid coils.

6. The method according to claim 3, wherein the solution is non-ionic, and the sensor is an acoustic signature sensor.

7. The method according to claim 1, wherein the first chemical or the second chemical is deionized water.

8. The method according to claim 1, wherein the first and second chemicals are generated on-site.

9. The method according to claim 1, wherein the solution having a predetermined formulation is directly introduced into a semiconductor processing tool.

10. A method of continously blending a chemical solution for use in semiconductor processing, comprising the steps of:
(a) mixing a first chemical with a second chemical in a first mixing zone in a conduit system and in a real time controlled manner to provide a first solution having a predetermined formulation; the flowrate of the first chemical and the flowrate of the second chemical are continuously adjusted; the first solution formulation is continuously monitored; and
(b) mixing a third chemical with the first solution in a second mixing zone in said conduit system and in a real time controlled manner to provide a second solution having a predetermined formulation; the flowrate of the third chemical is continuously adjusted; second solution formulation is continuously monitored, wherein steps (a) and (b) are preformed contemporaneously.

11. The method according to claim 10 wherein step (a), the flowrate of the first chemical or the second chemical is controlled in response to a signal generated by a first sensor which monitors the first solution, and in step (b), the flowrate of the third chemical or the first solution is controlled in response to a signal generated by a second sensor with monitors the second solution.

12. The method according to claim 11, wherein the first sensor and the second sensor are of the same or different types, and are selected from the group consisting of conductivity sensors and acoustic signature sensors.

13. The method according to claim 12, wherein the first sensor and/or the second sensor is an AC toroid coil sensor.

14. The method according to claim 12, wherein the first solution and the second solution are ionic solutions, and the first sensor and the second sensor are conductivity sensors.

15. The method according to claim 14, wherein the conductivity sensor is an electrodeless conductivity sensor employing AC toroid coils.

16. The method according to claim 12, wherein one of the first solution and the second solution is a non-ionic solution and the other of the first solution and the second solution is an ionic solution.

17. The method according to claim 10, wherein the first chemical or the second chemical is deionized water.

18. The method according to claim 10, further comprising:
(a) mixing a fourth chemical with the second solution in a real time controlled manner to provide a third solution having a predetermined formulation; the flowrate of the first chemical and the flowrate to the second solution are continuously adjusted; the third solution is continuously monitored; and wherein steps (a) and (b) are performed contemporaneously.

19. The method according to claim 10, wherein the second solution having a predetermined formulation is directly introduced into a semiconductor processing tool.

20. The method according to claim 10, wherein the second mixing zone is arranged downstream from the first mixing zone.

21. A method of continuously blending a chemical solution on-site at a semiconductor manufacturing facility, comprising the steps of:
(a) mixing a first chemical with a second chemical in a first mixing zone in a conduit system and in a real time controlled manner to provide a first solution having a predetermined formulation; the flowrate of the first chemical and the flowrate of the second chemical are continuously adjusted; the first solution is continuously monitored, and
(b) mixing a third chemical with the first solution in a second mixing zone in said conduit system and in a real time controlled manner to provide a second solution having a predetermined formulation; the flowrate of the third chemical is continuously adjusted; the second solution formulation is continuously monitored, and
(c) introducing the second solution having a predetermined formulation into a semiconductor processing tool, wherein steps (a) and (b) are performed contemporaneously.

22. The method according to claim 21, further comprising the steps (b), (c), and a step (b') mixing a fourth chemical with the second solution in a real time controlled manner to provide a third solution having a predetermined formulation,
(b) the flowrate of the fourth chemical is continuously adjusted; the third solution formulation is continuously monitored, and wherein step (b) is performed contemporaneously with steps (a) and (b).

23. The method according to claim 21, wherein the second solution having a predetermined formulation is directly introduced into a semiconductor processing tool.

* * * * *

UNITED STATES PATENT AND TRADEMARK OFFICE
CERTIFICATE OF CORRECTION

PATENT NO.    : 6,799,883 B1
DATED         : October 5, 2004
INVENTOR(S)   : Karl J. Urquhart, John B. Thompson and Joe G. Hoffman It is certified that error appears in the above-identified patent and that said Letters Patent is hereby corrected as shown below:

Column 11,
Line 17, please replace the word "preformed" with the word -- performed --.
Line 23, please replace the word "with" with the word -- which --.

Column 12,
Line 2, please replace the word "to" with the word -- of --.

Signed and Sealed this

Twenty-second Day of February, 2005

JON W. DUDAS
*Director of the United States Patent and Trademark Office*